United States Patent
Chi

[11] Patent Number: 6,163,482
[45] Date of Patent: Dec. 19, 2000

[54] ONE TRANSISTOR EEPROM CELL USING FERRO-ELECTRIC SPACER

[75] Inventor: Min-hwa Chi, Hsinchu, Taiwan

[73] Assignee: Worldwide Semiconductor Manufacturing Corporation, Hsinchu, Taiwan

[21] Appl. No.: 09/378,558

[22] Filed: Aug. 19, 1999

[51] Int. Cl.[7] .............................. G11C 16/04; G11C 11/22

[52] U.S. Cl. .................. 365/185.18; 365/145; 257/295

[58] Field of Search ............................ 365/185.18, 145; 257/295

[56] References Cited

U.S. PATENT DOCUMENTS

| | | | |
|---|---|---|---|
| 5,119,329 | 6/1992 | Evans, Jr. et al. | 365/145 |
| 5,666,305 | 9/1997 | Mihara et al. | 365/145 |

*Primary Examiner*—Trong Phan
*Attorney, Agent, or Firm*—Blakely, Sokoloff, Taylor, & Zafman

[57] ABSTRACT

A new one-transistor EEPROM cell structure using a spacer of ferro-electric material (e.g. PZT or BST). The spacer's polarization can be alterable and is used as the storage element of digital information. This new cell offers small cell size, low voltage operation, high endurance, fast write operation, and full function EEPROM compared to conventional EEPROM or F-RAMS.

14 Claims, 3 Drawing Sheets

ONE TRANSISTOR EEPROM CELL USING FERRO-ELECTRIC SPACER

RELATED APPLICATIONS

This application claims the benefit of Taiwan application serial number 88108613, filed May 26, 1999, the benefit of which is hereby claimed under 35 U.S.C. § 119.

FIELD OF THE INVENTION

The present invention relates to EEPROM, and more particularly, to a one-transistor EEPROM cell using a spacer of ferro-electric material.

BACKGROUND OF THE INVENTION

A typical 2-transistor (2T) EEPROM, as shown in FIG. 1, consists of one floating-gate n-channel memory cell (e.g. FLOTOX or flash types) as well as one n-channel MOS transistor as the access switch. The FLOTOX cell has a small window (not shown in FIG. 1) with a thin tunnel oxide formed between the drain and the floating-gate to allow electrons to tunnel through when a sufficient electrical field is applied. The flash cell in FIG. 1 is a simple stack floating-gate transistor with a thin tunnel oxide between the floating-gate and the channel of the cell. The floating gate can be negatively charged (i.e. programmed) or discharged (i.e. erased) by allowing electrons to move through the thin tunnel oxide (~80 A to 110 A) under a high electric field (~10MV/cm) through a process known as Fowler-Nordheim (F-N) tunneling mechanism. The access transistor switch is used for isolating the memory cell from column circuits and it facilitates the program and erase operations of one single cell. In contrast, flash memory (without the access transistor for each cell) can only be erased in blocks. Certainly the 2T EEPROM cell is large in size compared with the 1T flash cell, although it has full non-volatile functions.

There are drawbacks to both the 2T EEPROM cell or the 1T flash cell. First, the F-N tunneling program or erase requires high voltage operation. Therefore, the fabrication process is more complicate by including additional process considerations for high-voltage transistors, isolations and junctions, as well as the tunnel oxide and floating-gate. Second, the program and erase operations are not fast (in the range of 10 msec to 100 msec). Third, the endurance of the program-erase cycle is limited to ~1 million cycles or less due to the degradation of the tunnel oxide by electrons during program or erase.

As a result, the polarization of ferro-electric materials (e.g. PZT) as the non-volatile storage element has been proposed. These materials provide much faster write operations (~100 ns), higher cycling endurance (by several orders), and low-voltage operation as described below.

A conventional 1T ferro-electric cell, as shown in U.S. Pat. No. 5,666,305 and as sketched in FIG. 2, is similar to a flash cell except that there is no poly floating-gate needed. The ferro-electric material is fabricated in the multi-layer stack of gate-oxide over the channel. A short review of the basic properties of ferro-electric material for memory application is found in R. E. Jones, "Ferro-Electric Nonvolatile Memories for Embedded Applications", Paper No. 21.4, IEEE Custom Integrated Circuits Conference, p. 431, 1998. The polarization in the ferro-electric layer may have polarities that either reduce or increase the threshold voltage (Vt) of the transistor. Therefore, the polarities of the polarization can be used to represent the digital information of "1" or "0." The polarization can be altered (by the "write" operation) by applying a sufficient electric field with the proper polarity.

The establishment of polarization in the ferro-electric material is due to the separation of polarized atoms in the domains and the growth of polarized domains in the ferro-electric material by applied electric field. It is not related to a physical charge being transported through or to the material. Therefore, the damage of the ferro-electric material by alteration of the polarity polarization is much less than to an oxide by electron tunneling. The endurance of ferro-electric non-volatile cells has been demonstrated to be >$10^8$ cycles (several orders of magnitude better than tunneling oxide based EEPROM or flash cell). Furthermore, the alteration of polarization is a fast mechanism (in the range of 10 nsec to 100 nsec).

Another prior art non-volatile ferro-electric cell described in R. E. Jones, cited above, is similar to a DRAM. This is shown in FIG. 3 as consisting of one n-MOS transistor connected to a capacitor with a ferro-electric material as the dielectric. The cell can be used as a conventional DRAM cell regardless of the existing polarization in the capacitor. The non-volatile information, stored in the polarization (with either polarity representing "1" or "0") in the capacitor, can be read by sensing the magnitude of charge flowing out of the capacitor when pulsing the plate electrode to a large bias. This read operation of the non-volatile information is a destructive process, since the polarization in each capacitor is forced into the same polarity. Therefore a rewrite operation is required after the read operation.

SUMMARY OF THE INVENTION

The present invention describes a new ferro-electric non-volatile cell, which has a spacer of ferro-electric material (e.g. PZT or BST). The spacer's polarization is used for storing digital information. This new cell has the advantage of small size (comparable to the 1T ferro-electric cell), single-bit write operation (same as a 2T cell), and non-destructive read operation.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

The memory cell of the present invention is similar to a conventional n-channel MOS transistor except that there is a spacer at the drain side formed from a ferro-electric material (e.g. PZT or BST). Additionally, the drain is a p+/n− double implanted drain. A corresponding p-channel MOS transistor with ferro-electric spacer and an n+/p− double implanted drain can also be formed for similar function described below.

Figure 1:
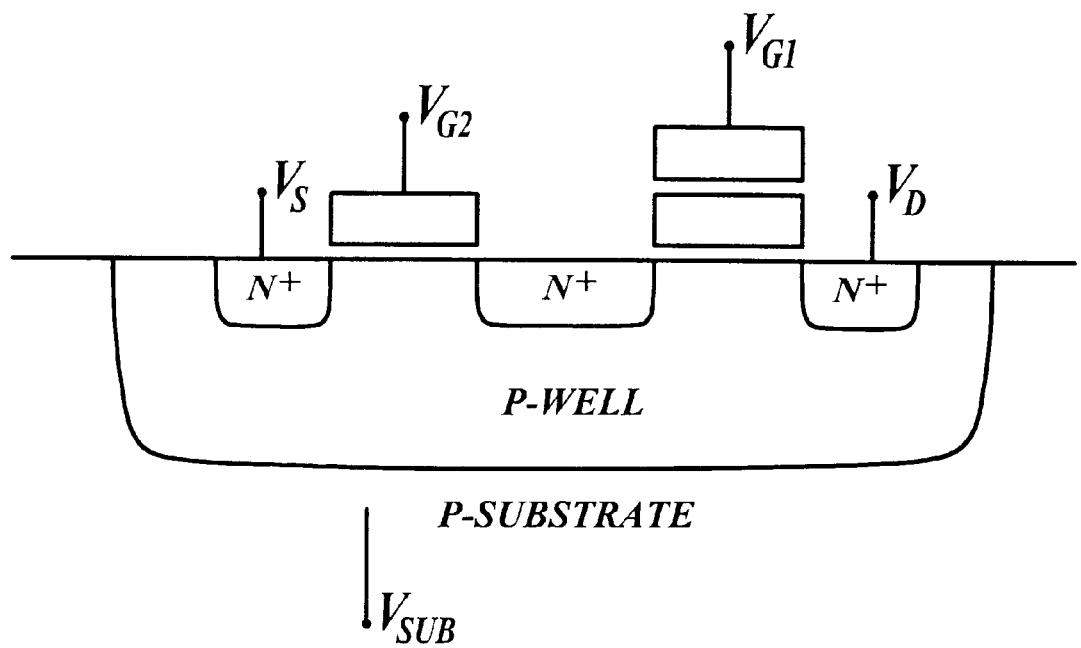
FIG. 1 is a schematic diagram of a prior art two-transistor EEPROM cell.
Figure 2:
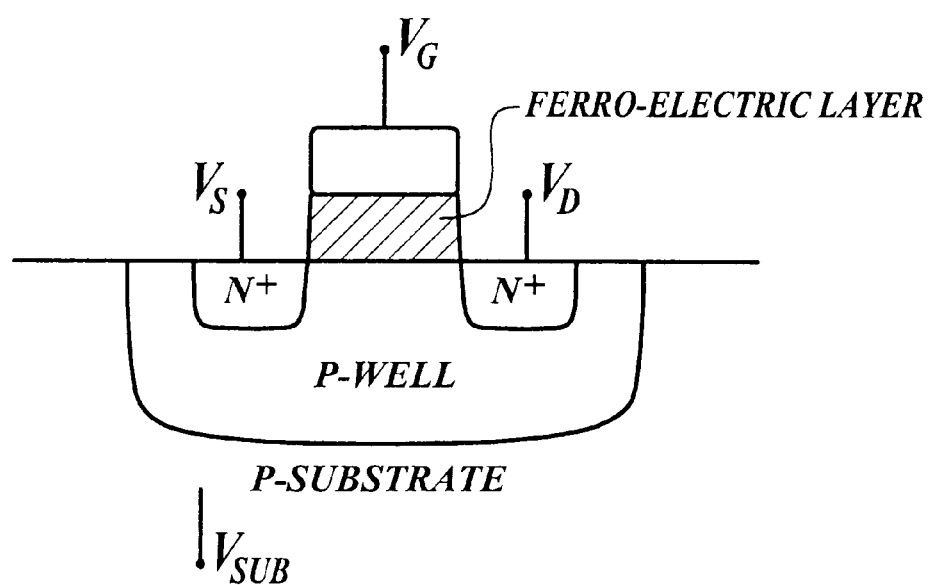
FIG. 2 is a schematic diagram of a prior art one-transistor ferro-electric non-volatile memory cell.
Figure 3:
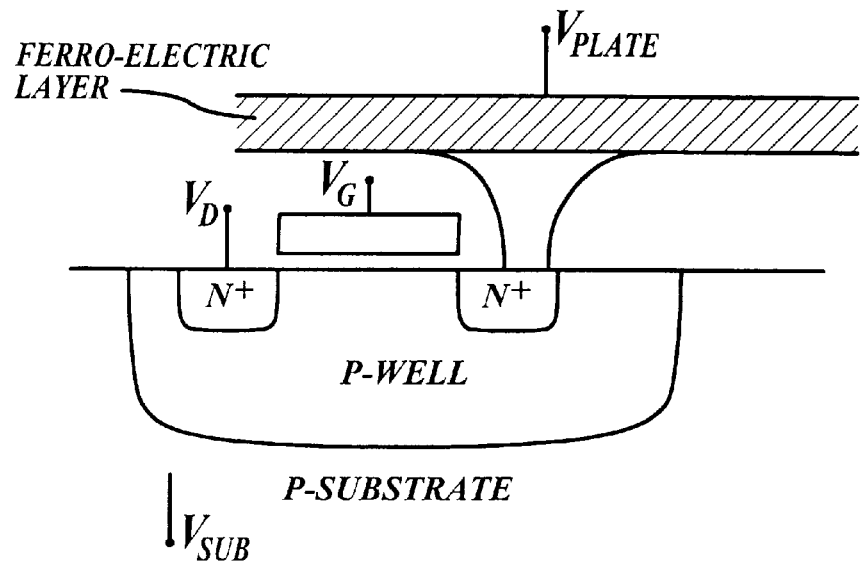
FIG. 3 is a schematic diagram of a prior art F-RAM cell.
Figure 4:
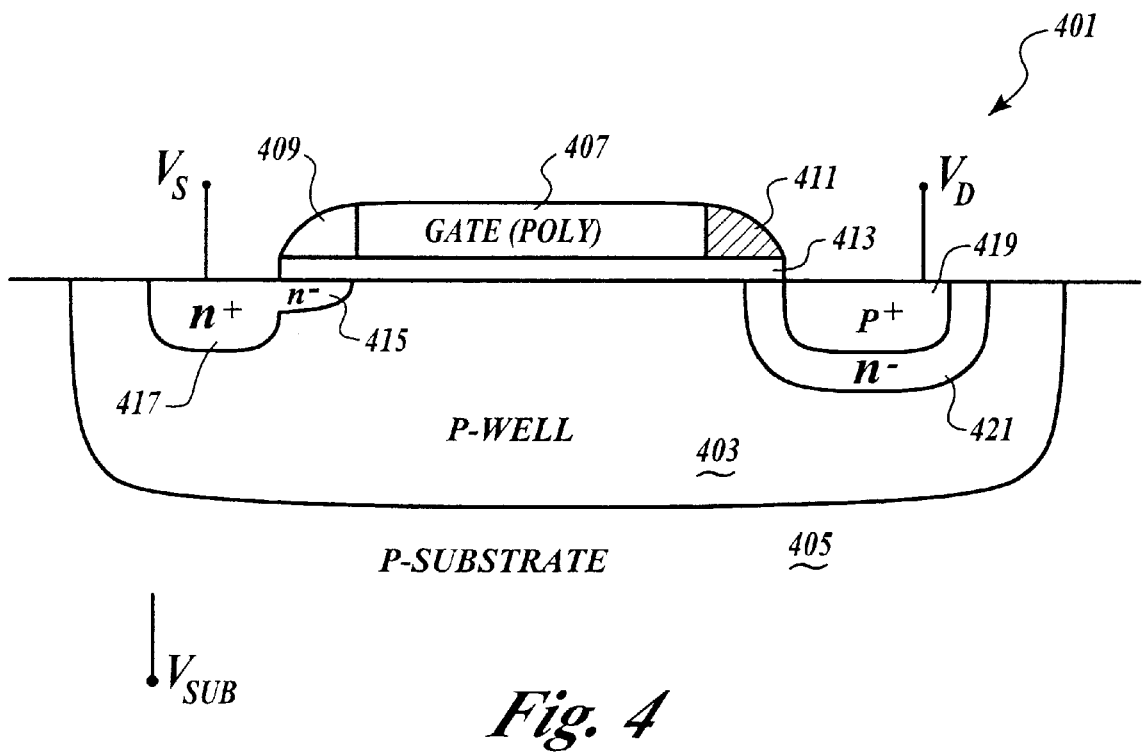
FIG. 4 is a schematic diagram of a memory formed in accordance with the present invention.

Specifically, turning to FIG. 4, a cell 401 formed in accordance with the present invention is shown. The cell 401 is formed within and atop of a p-well 403 formed in a p-type substrate 405. The cell 401 includes a polysilicon (or polycide) gate 407 of conventional shape and design. The polysilicon gate 407 has two sidewalls. Formed adjacent to one of the sidewalls of the gate 407 is an oxide spacer 409. The oxide spacer 409 can be formed using conventional oxide CVD and etchback. The oxide spacer 409 serves the purpose of aiding in the formation of a lightly doped drain (LDD) structure 415. In other words, prior to formation of the LDD 409, the gate 407 is used as a self-aligned mask for ion implantation for the LDD 409. After the oxide spacer 409 is formed, a source 417 is formed in the p-well 403 and adjacent the LDD 409 (using the LDD 409 as a mask).

Formed adjacent to the other sidewall of the gate 407 is a ferro-electric spacer 411. The ferro-electric spacer 411 can be formed using conventional CVD deposition of ferro-electric material and etchback. Preferably, the ferro-electric spacer 411 is formed from PZT or BST material, or any of the materials mentioned in U.S. Pat. No. 5,666,305 and by the deposition techniques described therein. Formed adjacent to the ferro-electric spacer 411 and within the p-well 403 is an n– region 421. Formed within the n– region 421 is a p+ drain 419.

Additionally, as seen in FIG. 4, the gate 407, the oxide spacer 409, and the ferro-electric spacer 411 are all formed atop of a thin gate oxide layer 413 (typically 80 to 120 angstroms thick).

The ferro-electric spacer 411 serves as a storage element with the channel underneath the ferro-electric spacer modulated by the polarization of the spacer 411 (for either conducting or non-conducting representing the digital information of "1" or "0"). The n– region in the p+/n– double implanted drain is floating and isolates the p+ and p-well so that either positive or negative bias can be applied at p+ drain for "writing" a proper polarity into the polarization of the spacer. Details of the "write" operation will be described next.

The polarization can be set (or written) by the applied bias between the gate and the drain. The cell design is such that by applying positive and negative Vcc (e.g. Vcc~3.3v) to the gate 407 and the p+ drain 419, there will be large enough electric field magnitude to change the polarization of the ferro-magnetic spacer 411. The cell design parameters include the length and thickness of the ferro-electric material as well as the dielectric constant of the material.

Figure 5:
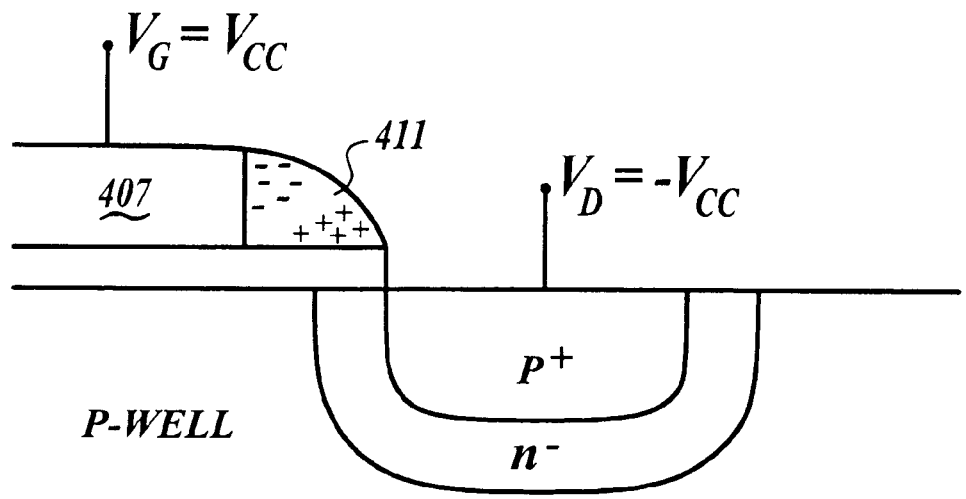
FIG. 5 is a schematic diagram of the cell of FIG. 4 during a write "1" operation.

The write "1" operation is illustrated in FIG. 5. The resulting polarization in the ferro-electric spacer 411 after the write "1" operation is from the gate 407 to the drain 419 and is arbitrarily denoted by "1." To write a "1", the voltage $V_{cc}$ is applied to the gate 407 and the voltage $-V_{cc}$ is applied to the drain 419. This results in the channel underneath the spacer 411 to be inverted and the cell 401 is conducting during read operation ($V_g \sim V_{cc}$ and $V_d \sim 1v$). Note that the p+/n– drain is a forward-biased diode, and the field across the spacer 411, between the gate 407 and drain 419 is small and there is negligible disturb or reduction of the polarization in spacer during read. The read bias (by setting $V_g$ to $V_{cc}$ and $V_d$ to about 1 volt) introduces negligible disturb of the magnitude of polarization on those unselected cells on the same row or column. During read and write operation, the p-well is grounded to 0 volts.

Figure 6:
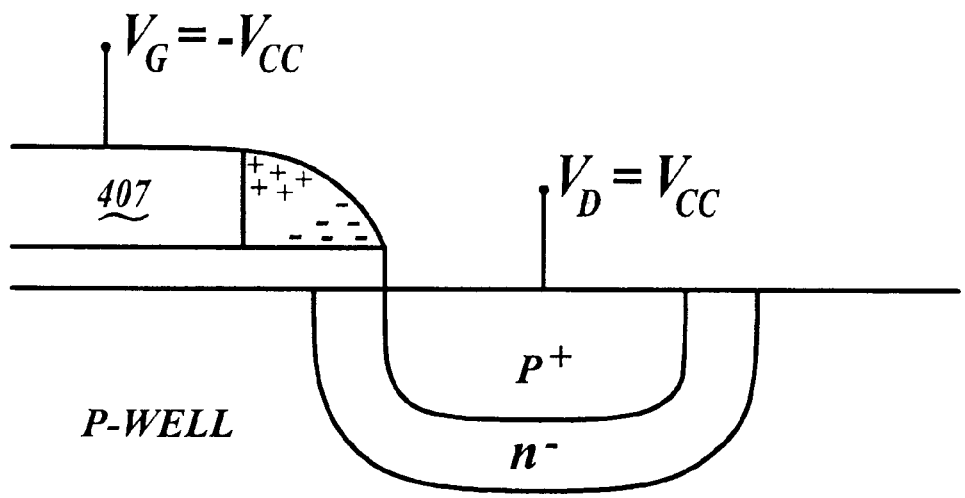
FIG. 6 is a schematic diagram of the cell of FIG. 4 during a write "0" operation.

The write "0" operation is illustrated in FIG. 6. The resulting polarization in the ferro-electric spacer 411 after the write "0" operation is from the drain 419 to the gate 407 and is arbitrarily denoted by "0." To write a "0", the voltage $-V_{cc}$ is applied to the gate 407 and the voltage $V_{cc}$ is applied to the drain 419. This results in the channel underneath the spacer 411 to be depleted and the cell 401 is not conducting during read operation. There is negligible read disturb (by setting $V_g$ to $V_{cc}$ and $V_d$ to about 1 volt) on both the selected cell and unselected cells in the same row or column.

The cell 401 is actually a merged 2T cell (one for column switch, and the other merged into the spacer as the memory cell). The ferro-electric material used for non-volatile memory has the advantage of low-voltage operation and almost infinite cycling endurance (>$10^8$ cycles). The new 1T ferro-electric cell 401 has additional advantages over the prior art of ferro-electric non-volatile memory by having a smaller cell size, non-destructive read operation, and full EEPROM function of single-bit write operation.

The method of fabrication for the cell follows a conventional CMOS process closely. The n– lightly doped drain implant is only at the source side using a conventional 1 dd spacer (using an extra masking step for removing the unneeded oxide spacer from the drain side). Then the ferro-electric spacer is formed by the deposition and etch-back of the PZT or BST materials. Notice that the ferro-electric spacer is etch-backed enough so that there is no residue on the source side and other normal transistors. Also note that there is a thin native oxide along the polysilicon edge and on the channel area underneath the ferro-electric spacer. The conducting gate material can be doped polysilicon, or silicide, or metal.

The cell of the present invention can also easily be formed into a conventional NOR array. However, the column decoder will require modification so that both positive and negative bias can be applied to the columns.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An EEPROM cell formed on a semiconductor substrate comprising:
   a p-well formed in said substrate;
   a conductive gate formed over a thin oxide layer, said conductive gate having a first and second sidewall and formed over said p-well;
   an n-type source region formed in said p-well and adjacent said first sidewall spacer;
   a ferro-electric spacer formed adjacent said second sidewall of said conductive gate and atop said thin oxide layer;
   an n– isolation region formed within said p-well and adjacent said ferro-electric spacer; and
   a p-type drain region formed within said n– isolation region.

2. The cell of claim 1 further including an oxide spacer between said source region and said first sidewall, said oxide spacer used for forming a lightly doped drain in said p-well and underneath said oxide spacer.

3. The cell of claim 1 wherein said conductive gate is formed from polysilicon or polycide ($TiSi_2 CoSi_2$) or metal (W).

4. The cell of claim 1 wherein said ferro-electric spacer is formed from PZT or BST.

5. The cell of claim 1 wherein to write a "1" to said cell, a voltage $V_{cc}$ is applied to said conductive gate and a voltage $-V_{cc}$ is applied to said drain.

6. The cell of claim 1 wherein to write a "0" to said cell, a voltage $-V_{cc}$ is applied to said conductive gate and a voltage $V_{cc}$ is applied to said drain.

7. The cell of claim 1 wherein to read said cell, a voltage $V_{cc}$ is applied to said conductive gate and a voltage of about 1 volt is applied to said drain, the source is grounded.

8. An EEPROM cell formed on a semiconductor substrate comprising:
   an n-well formed in said substrate;
   a conductive gate formed over a thin oxide layer, said conductive gate having a first and second sidewall and formed over said n-well;
   a p-type source region formed in said n-well and adjacent said first sidewall spacer;
   a ferro-electric spacer formed adjacent said second sidewall of said conductive gate and atop said thin oxide layer;
   a p-isolation region formed within said n-well and adjacent said ferro-electric spacer; and
   an n-type drain region formed within said n– isolation region.

9. The cell of claim 8 further including an oxide spacer between said source region and said first sidewall, said oxide spacer used for forming a lightly doped drain in said n-well and underneath said oxide spacer.

10. The cell of claim 8 wherein said conductive gate is formed from polysilicon or polycide ($TiSi_2CoSi_2$) or metal (W).

11. The cell of claim 8 wherein said ferro-electric spacer is formed from PZT or BST.

12. The cell of claim 8 wherein to write a "1" to said cell, a voltage $V_{cc}$ is applied to said conductive gate and a voltage $-V_{cc}$ is applied to said drain.

13. The cell of claim 8 wherein to write a "0" to said cell, a voltage $-V_{cc}$ is applied to said conductive gate and a voltage $V_{cc}$ is applied to said drain.

14. The cell of claim 8 wherein to read said cell, a voltage 0V is applied to said conductive gate and a voltage of about 1 volt less than $V_{cc}$ (i.e., $V_{cc}-1v$) is applied to said drain, the source is biased at $+V_{cc}$.

* * * * *